US012701923B2

(12) United States Patent
Chen et al.

(10) Patent No.: US 12,701,923 B2
(45) Date of Patent: Aug. 4, 2026

(54) VIBRATION DEVICE, TOUCH DISPLAY PANEL AND ELECTRONIC PRODUCT

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Yuju Chen, Beijing (CN); Hui Hua, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 78 days.

(21) Appl. No.: 18/033,622

(22) PCT Filed: May 26, 2022

(86) PCT No.: PCT/CN2022/095255
§ 371 (c)(1),
(2) Date: Apr. 25, 2023

(87) PCT Pub. No.: WO2023/225948
PCT Pub. Date: Nov. 30, 2023

(65) Prior Publication Data
US 2024/0389464 A1     Nov. 21, 2024

(51) Int. Cl.
| *G06F 3/01* | (2006.01) |
| *H10N 30/85* | (2023.01) |
| *H10N 30/853* | (2023.01) |
| *H10N 30/88* | (2023.01) |
| *H10N 39/00* | (2023.01) |
| *G06F 3/041* | (2006.01) |

(52) U.S. Cl.
CPC ........... *H10N 30/883* (2023.02); *G06F 3/016* (2013.01); *H10N 30/85* (2023.02); *H10N 30/8542* (2023.02); *H10N 30/8554* (2023.02); *H10N 39/00* (2023.02); *G06F 3/041* (2013.01)

(58) Field of Classification Search
CPC .......... G06F 3/016; G06F 3/041; H10N 39/00
See application file for complete search history.

(56) References Cited

U.S. PATENT DOCUMENTS

| 10,833,244 B2 | 11/2020 | Yonemura et al. | |
| 2011/0102343 A1* | 5/2011 | Imai ........................ | G06F 3/041 |
| | | | 345/173 |

(Continued)

FOREIGN PATENT DOCUMENTS

| CN | 103795369 A | 5/2014 |
| CN | 106994829 B | 6/2018 |

(Continued)

*Primary Examiner* — Yuzhen Shen
(74) *Attorney, Agent, or Firm* — LEASON ELLIS LLP

(57) ABSTRACT

A vibration device, a touch display panel and an electronic product are provided. The vibration device includes a base substrate, a first transparent conductive anti-diffusion layer and a piezoelectric material layer. The first transparent conductive anti-diffusion layer is located on the base substrate; the piezoelectric material layer is located at a side of the first transparent conductive anti-diffusion layer away from the base substrate, and the first transparent conductive anti-diffusion layer is configured to prevent oxygen from entering the piezoelectric material layer.

20 Claims, 5 Drawing Sheets

(56) References Cited

U.S. PATENT DOCUMENTS

| | | | |
|---|---|---|---|
| 2013/0196469 A1* | 8/2013 | Facchetti | H01L 21/28506 |
| | | | 438/778 |
| 2014/0117815 A1* | 5/2014 | Bi | H03H 3/04 |
| | | | 310/346 |
| 2016/0087198 A1* | 3/2016 | Chang | H10N 70/24 |
| | | | 257/4 |
| 2017/0179368 A1 | 6/2017 | Sumi et al. | |
| 2018/0138392 A1 | 5/2018 | Isshiki et al. | |
| 2018/0287045 A1* | 10/2018 | Tabuchi | H10N 30/878 |
| 2020/0006622 A1* | 1/2020 | Murakami | C01G 33/006 |
| 2022/0085274 A1* | 3/2022 | Nakamura | C04B 35/62222 |
| 2023/0099288 A1* | 3/2023 | Wang | B06B 1/0625 |
| | | | 345/156 |
| 2023/0341938 A1* | 10/2023 | Ono | G06F 3/016 |

FOREIGN PATENT DOCUMENTS

| | | | | |
|---|---|---|---|---|
| CN | 110868171 A | | 3/2020 | |
| CN | 108068458 B | | 12/2020 | |
| JP | 2000077740 A | | 3/2000 | |
| JP | 2005247630 A | * | 9/2005 | C01G 19/00 |
| JP | 6332596 B2 | | 5/2018 | |

* cited by examiner

100

<u>100</u>

100

200

200

VIBRATION DEVICE, TOUCH DISPLAY PANEL AND ELECTRONIC PRODUCT

CROSS-REFERENCE TO RELATED PATENT APPLICATIONS

This application is a U.S. National Stage Application under 35 U.S.C. § 371 of International Patent Application No. PCT/CN2022/095255, filed May 26, 2022, which is incorporated by reference in its entirety.

TECHNICAL FIELD

Embodiments of the present disclosure relate to a vibration device, a touch display panel and an electronic product.

BACKGROUND

At present, haptic feedback (haptics) is the focus of current technology development. Its concept is that with the help of haptic technology, electronic equipment manufacturers can create distinctive personalized haptics for specific interactive experiences on their devices, thus providing consumers with more valuable and more realistic unique experiences.

Haptics can be divided into two categories, one is vibration feedback and the other is haptic reproduction technology. Vibration feedback is to provide haptic feedback and vibration reminder for users by adding a linear motor to the display device. Surface haptic reproduction technology can perceive the characteristics of objects by touching the screen with the skin (fingertips), and can achieve efficient and realistic interaction in multimedia terminals, which has great research value, so it has been widely concerned by researchers at home and abroad. In physical sense, the surface haptics is that the surface of an object acts on the surface of the skin (fingertip), and different friction forces are formed due to different surface structures. Therefore, different haptics or tactile sensations can be simulated by controlling the surface friction.

SUMMARY

Embodiments of the present disclosure provide a vibration device, a touch display panel and an electronic product. By arranging the first transparent conductive anti-diffusion layer, its own oxygen can be prevented from entering the piezoelectric material layer, so that the electric conductivity of the first conductive anti-diffusion layer will not be reduced, and the display efficiency will not be reduced; besides, the first transparent conductive anti-diffusion layer itself has electric conductivity and can be used as a driving electrode of the piezoelectric material.

At least one embodiment of the present disclosure provides a vibration device, which includes a base substrate, a first transparent conductive anti-diffusion layer, and a piezoelectric material layer; the first transparent conductive anti-diffusion layer is located on the base substrate; the piezoelectric material layer is located at a side of the first transparent conductive anti-diffusion layer away from the base substrate, the first transparent conductive anti-diffusion layer is configured to prevent oxygen from entering the piezoelectric material layer.

For example, in a vibration device provided by an embodiment of the present disclosure, a material of the first transparent conductive anti-diffusion layer is a doped transparent conductive oxide.

For example, in a vibration device provided by an embodiment of the present disclosure, a material of the first transparent conductive anti-diffusion layer is a fluorine-doped indium tin oxide.

For example, in a vibration device provided by an embodiment of the present disclosure, the piezoelectric material layer is a transparent piezoelectric thin film.

For example, in a vibration device provided by an embodiment of the present disclosure, a material of the piezoelectric material layer is one or more of selected from the group consisting of lead zirconate titanate, aluminum nitride and potassium sodium niobite.

For example, in a vibration device provided by an embodiment of the present disclosure, a thickness of the first transparent conductive anti-diffusion layer ranges from 25 nm to 1000 nm.

For example, in a vibration device provided by an embodiment of the present disclosure, a thickness of the piezoelectric material layer ranges from 1 μm to 10 μm.

For example, a vibration device provided by an embodiment of the present disclosure further includes: a first transparent electrode, located at a side of the base substrate close to the first transparent conductive anti-diffusion layer.

For example, in a vibration device provided by an embodiment of the present disclosure, a material of the first transparent electrode is a transparent conductive oxide.

For example, in a vibration device provided by an embodiment of the present disclosure, the material of the first transparent electrode is indium tin oxide.

For example, in a vibration device provided by an embodiment of the present disclosure, a thickness of the first transparent electrode ranges from 100 nm to 500 nm.

For example, in a vibration device provided by an embodiment of the present disclosure, an electric conductivity of the first transparent conductive anti-diffusion layer is smaller than an electric conductivity of the first transparent electrode.

For example, a vibration device provided by an embodiment of the present disclosure further includes: a second transparent electrode located at a side of the piezoelectric material layer away from the base substrate.

For example, a vibration device provided by an embodiment of the present disclosure further includes: a second transparent conductive anti-diffusion layer located between the piezoelectric material layer and the second transparent electrode layer.

For example, in a vibration device provided by an embodiment of the present disclosure, a material of the second transparent electrode is a transparent conductive oxide.

For example, in a vibration device provided by an embodiment of the present disclosure, the piezoelectric material layer is formed by magnetron sputtering or vapor deposition.

At least one embodiment of the present disclosure provides a touch display panel, which includes any one of the abovementioned vibration device.

At least one embodiment of the present disclosure provides an electronic product, which includes any one of the abovementioned touch display panel.

BRIEF DESCRIPTION OF DRAWINGS

In order to more clearly explain the technical solutions of the embodiments of the present disclosure, the following will briefly introduce the drawings of the embodiments. Obviously, the drawings in the following description only relate to some embodiments of the present disclosure, but not limit the present disclosure.

DETAILED DESCRIPTION

Figure 1:
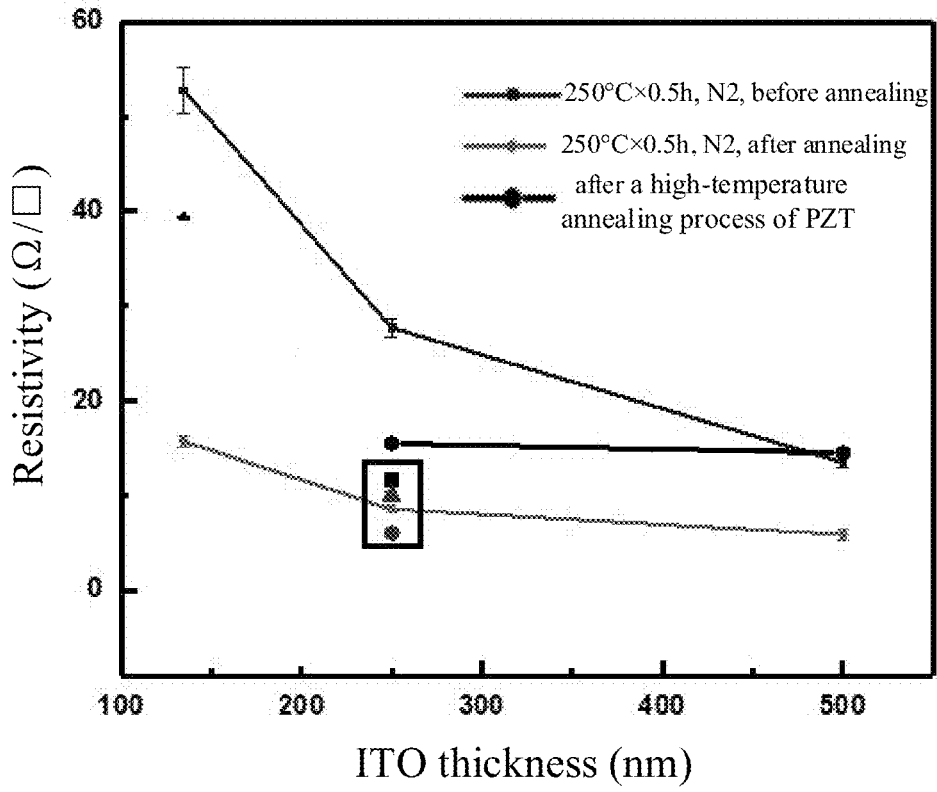
FIG. 1 is a schematic diagram of changes of sheet resistance of ITO films with different thicknesses with heat treatment process.

In order to make objects, technical solutions and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising." "includes," "including." etc., are intended to specify that the elements or the objects stated before these terms encompass the elements or the objects listed after these terms as well as equivalents thereof, but do not exclude other elements or objects. Similar words such as "connected" or "connected" are not limited to physical or mechanical connection, but can include electrical connection, whether direct or indirect. "Up", "down", "left" and "right" are only used to indicate the relative positional relationship. When the absolute position of the described object changes, the relative positional relationship may also change accordingly.

The components or structures in the drawings are not drawn strictly to scale, and the dimensions of the components or structures may be exaggerated or reduced for the sake of clarity, but these should not be used to limit the scope of the present disclosure. In order to keep the following description of the embodiments of the present disclosure clear and concise, detailed descriptions of known functions and known components may be omitted.

In the technical field of surface haptic reproduction, vibration devices are used as vibration sources to make the screen vibrate, so that the surface of the screen forms different friction forces, so that different haptics or tactile sensations can be simulated; on the other hand, lead zirconate titanate (PZT) piezoelectric material is very suitable for vibration devices integrated on the screen because of its high dielectric constant and transparency.

There are many methods to form lead zirconate titanate (PZT) piezoelectric material, including a dry coating film method and a wet coating film method, but high-temperature annealing process is needed to achieve good piezoelectric constant characteristics. The high-temperature annealing process requires PZT grain growth in high temperature (for example, 550° C.-650° C.) air environment to form a good solid solution phase. On the other hand, indium tin oxide (ITO) has high visible light transmittance and high electric conductivity, and is a common transparent electrode material for touch display screens. If ITO is annealed at high temperature (for example, above 350° C.), it will produce insufficient oxygen vacancies, which will greatly reduce the overall electric conductivity of ITO.

FIG. 1 is a schematic diagram of changes of sheet resistance of ITO films with different thicknesses with heat treatment process. As illustrated by FIG. 1, the sheet resistance of ITO is obviously decreased under a low-temperature annealing process of 250° C., but under a high-temperature (for example, between 550° C. and 650° C.) annealing process of forming PZT, the sheet resistance of ITO is about twice as high as that after the low-temperature annealing process, so the high-temperature annealing process of PZT will cause the electric conductivity of ITO to decrease. Meanwhile, due to the rising sheet resistance of ITO thin film, the charge distribution is uneven, which will further bring a problem of charge accumulation breakdown or burning.

Figure 2A:
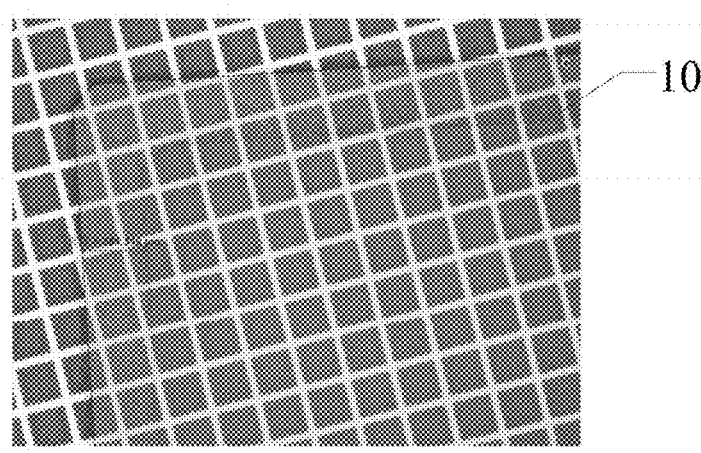
FIG. 2*a* is a schematic structural diagram of adding a metal meshbetween an ITO thin film and a PZT thin film.
Figure 2B:
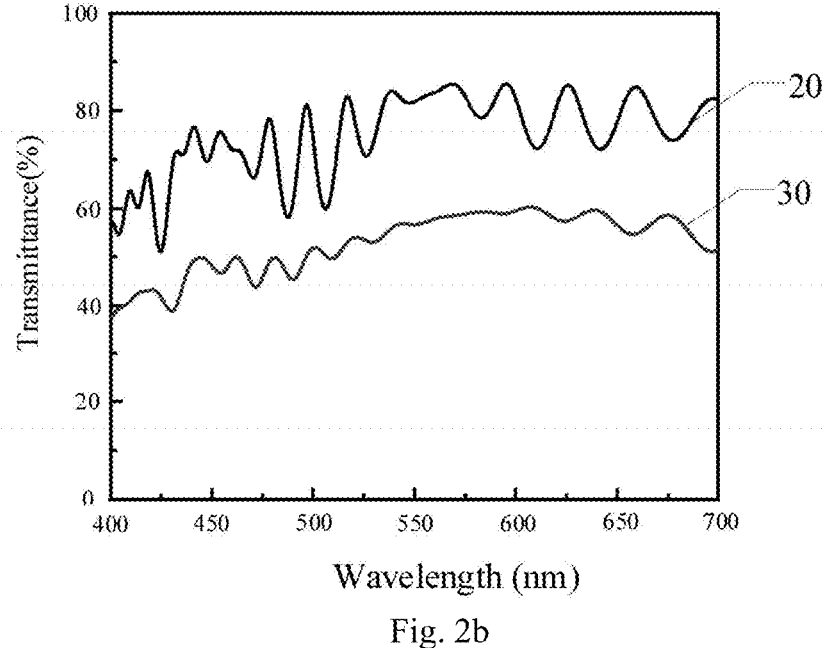
FIG. 2*b* is a curve graph of transmittances of ITO thin films on different substrates.

In order to solve the problem that the sheet resistance of ITO increases due to the high-temperature annealing process of PZT, which leads to the decrease of ITO electric conductivity, an additional metal mesh can be added between the ITO thin film and the PZT thin film to improve the overall electric conductivity. FIG. 2*a* is a schematic structural diagram of adding the metal mesh between ITO thin film and PZT thin film. As illustrated by FIG. 2*a*, by arranging a metal mesh 10 between the ITO thin film and the PZT thin film, the problem that the electric conductivity of ITO decreases due to the high-temperature annealing process of PZT can be solved. However, the addition of the metal mesh 10 may cause a problem of decreased light transmittance. FIG. 2*b* is a curve graph of transmittances of ITO thin films on different substrates. As illustrated by FIG. 2*b*, curve 20 illustrates a transmittance of ITO thin film on a substrate without adding metal mesh 10 between the ITO thin film and the PZT thin film, and curve 30 illustrates a transmittance of ITO thin film on a substrate with adding metal mesh 10 between the ITO thin film and the PZT thin film. After adding the metal mesh 10, the transmittance of ITO thin film on the substrate decreased from 80% to 50%, which reduced the display efficiency. Meanwhile, a material of the added metal mesh 10 needs to be difficult to be oxidized under the high-temperature annealing process of PZT, and because PZT is easy to lose oxygen under the high-temperature annealing process, the material of the metal mesh 10 further needs to have a characteristic that PZT oxygen cannot be diffused upon contacting with PZT. At present, the best material of the metal mesh 10 is precious metal platinum (Pt), so the use of the metal mesh 10 will further bring a problem of rising manufacturing cost.

With this regard, embodiments of the present disclosure provide a vibration device, a touch display panel and an electronic product. The vibration device includes a base substrate, a first transparent conductive anti-diffusion layer and a piezoelectric material layer. The first transparent conductive anti-diffusion layer is located on the base substrate, and the piezoelectric material layer is located on a side of the first transparent conductive anti-diffusion layer away from the base substrate. The first transparent conductive anti-diffusion layer is configured to prevent oxygen from entering the piezoelectric material layer. By arranging the first transparent conductive anti-diffusion layer, its own oxygen can be prevented from entering the piezoelectric material layer, so that the electric conductivity of the first conductive anti-diffusion layer will not be reduced, and the first transparent conductive anti-diffusion layer itself has electric conductivity and can be used as a driving electrode of the piezoelectric material. For example, during the high-temperature (e.g., the temperature is between 550° C. and 650° C.) annealing process of the piezoelectric material layer, the first transparent conductive anti-diffusion layer can prevent its own oxygen from entering the piezoelectric material layer, so that the conductive performance of the first transparent conductive anti-diffusion layer will not be reduced, and the display efficiency will not be reduced.

Hereinafter, the vibration device, the touch display panel and the electronic product provided by the embodiments of the present disclosure will be described in detail with reference to the accompanying drawings.

Figure 3:
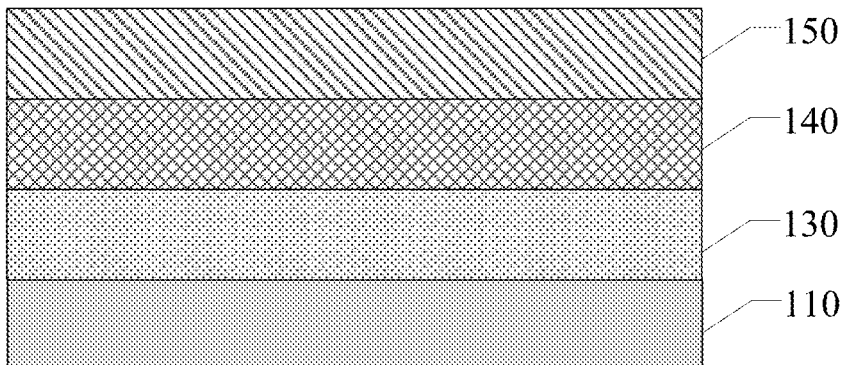
FIG. 3 is a schematic plan view of a vibration device provided by an embodiment of the present disclosure.

An embodiment of the present disclosure provides a vibration device. FIG. 3 is a schematic plan view of a vibration device provided by an embodiment of the present disclosure. As illustrated by FIG. 3, the vibration device 100 includes a base substrate 110, a first transparent conductive anti-diffusion layer 130 and a piezoelectric material layer 140. The first transparent conductive anti-diffusion layer 130 is located on the base substrate 110, and the piezoelectric material layer 140 is located on a side of the first transparent conductive anti-diffusion layer 130 away from the base substrate 110. The first transparent conductive anti-diffusion layer 130 is configured to prevent oxygen from entering the piezoelectric material layer 140.

In the vibration device 100 provided by the embodiment of the present disclosure, the first transparent conductive anti-diffusion layer 130 can prevent its own oxygen from entering the piezoelectric material layer 140, so that the electric conductivity of the first transparent conductive anti-diffusion layer 130 will not be reduced, and the first transparent conductive anti-diffusion layer 130 has its own electric conductivity and can be used as a driving electrode of the piezoelectric material. For example, during the high-temperature (e.g., the temperature is between 550° C. and 650° C.) annealing process of the piezoelectric material layer 140, the first transparent conductive anti-diffusion layer 130 can prevent its own oxygen from entering the piezoelectric material layer 140, so that the conductive performance of the first transparent conductive anti-diffusion layer 130 will not be reduced, and the display efficiency will not be reduced.

In some examples, as illustrated by FIG. 3, a material of the first transparent conductive anti-diffusion layer 130 may be a doped transparent conductive oxide.

In some examples, as illustrated by FIG. 3, the material of the first transparent conductive anti-diffusion layer 130 may be a fluorine-doped transparent conductive oxide.

For example, as illustrated by FIG. 3, the material of the first transparent conductive anti-diffusion layer 130 may be fluorine-doped indium tin oxide (FTO).

In some examples, as illustrated by FIG. 3, the piezoelectric material layer can be a transparent piezoelectric thin film, so that the touch display panel can have better light transmittance and improve the display efficiency.

In some examples, as illustrated by FIG. 3, the piezoelectric material layer may be one or more of selected from the group consisting of lead zirconate titanate (PZT), aluminum nitride (AlN) and potassium sodium niobate ((K0.5Na0.5) NbO3, KNN). Lead zirconate titanate has excellent piezoelectric and dielectric properties, good stability and high precision, and is widely used in the field of vibration devices. Aluminum nitride is a covalent bond compound with hexagonal wurtzite structure, which is usually gray or grayish white. It has the advantages of high thermal electric conductivity, high-temperature insulation, good dielectric properties, high material strength at high temperature and low thermal expansion coefficient. Potassium sodium niobate has the characteristics of high Curie temperature (about 420° C.), low dielectric constant, small mechanical quality factor, high frequency constant, and lead-free, which can reduce environmental pollution. Of course, embodiments of the present disclosure include but are not limited thereto.

For example, as illustrated by FIG. 3, in the case that the piezoelectric material layer is lead zirconate titanate, the lead zirconate titanate is easy to lose oxygen under the high-temperature (for example, between 550° C. and 650° C.) annealing process, and adding the first transparent conductive anti-diffusion layer between the piezoelectric material layer and the first transparent electrode can further play a role in preventing the lead zirconate titanate from losing oxygen.

In some examples, as illustrated by FIG. 3, a thickness of the first transparent conductive anti-diffusion layer 130 may be any value from 25 nm to 1000 nm. For example, the thickness of the first transparent conductive anti-diffusion layer 130 may be 50 nm, 100 nm, 200 nm, 400 nm, 600 nm and 800 nm.

In some examples, as illustrated by FIG. 3, a thickness of the piezoelectric material layer 140 is any value from 1 μm to 10 μm. For example, the thickness of the piezoelectric material layer 140 may be 2 μm, 4 μm, 6 μm. 8 μm and 9 μm.

In some examples, as illustrated by FIG. 3, the vibration device 100 further includes a second transparent electrode 150, which is located at a side of the piezoelectric material layer 140 away from the base substrate 110.

In some examples, as illustrated by FIG. 3, a material of the second transparent electrode 150 may be a transparent conductive oxide. For example, the second transparent electrode 150 may be ITO.

In some examples, the piezoelectric material layer 140 may be formed by magnetron sputtering or vapor deposition. Magnetron sputtering or vapor deposition is a common and mature process for forming thin films on a surface of the base substrate.

For example, the first transparent conductive anti-diffusion layer can also be formed by magnetron sputtering or vapor deposition.

Figure 4:
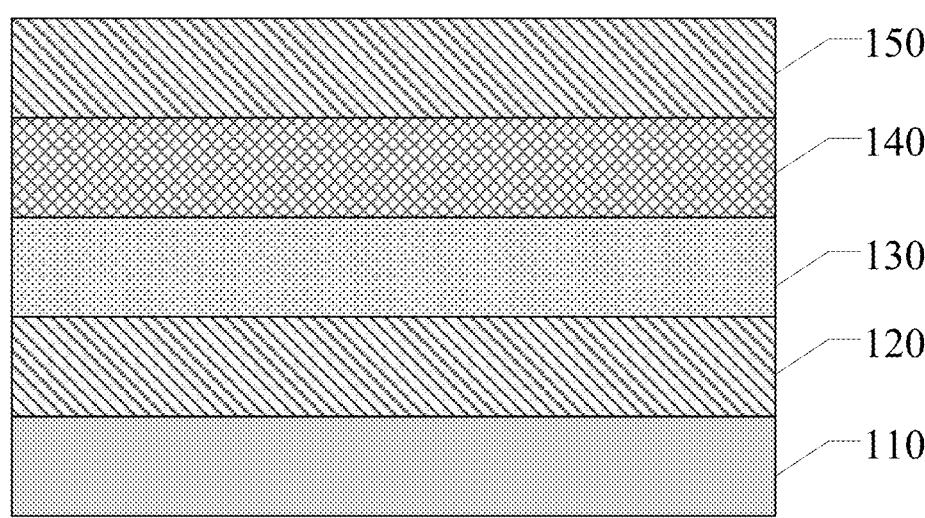
FIG. 4 is a schematic plan view of another vibration device provided by an embodiment of the present disclosure.

FIG. 4 is a schematic plan view of another vibration device provided by an embodiment of the present disclosure. As illustrated by FIG. 4, the vibration device 100 includes a base substrate 110, a first transparent electrode 120, a first transparent conductive anti-diffusion layer 130 and a piezo-electric material layer 140. The first transparent electrode 120 is located on the base substrate 110, the first transparent conductive anti-diffusion layer 130 is located on a side of the first transparent electrode 120 away from the base substrate 110, and the piezoelectric material layer 140 is located on a side of the first transparent conductive anti-diffusion layer 130 away from the base substrate 110. The first transparent conductive anti-diffusion layer 130 may prevent oxygen in the first transparent electrode 120 from entering the piezoelectric material layer 140.

In the vibration device 100 provided by the embodiment of the present disclosure, by arranging the first transparent conductive anti-diffusion layer 130 between the first transparent electrode 120 and the piezoelectric material layer 140, oxygen in the first transparent electrode 120 can be prevented from entering the piezoelectric material layer 140. For example, during the high-temperature (e.g., the temperature is between 550° C. and 650° C.) annealing process of the piezoelectric material layer 140, the first transparent conductive anti-diffusion layer 130 can prevent oxygen in the first transparent electrode 120 from entering the piezoelectric material layer 140, so that the electric conductivity of the first transparent electrode 120 will not be reduced, and the display efficiency will not be reduced. Moreover, the first transparent conductive anti-diffusion layer 130 itself has electric conductivity and can be used as a driving electrode of the piezoelectric material layer 140 together with the first transparent electrode 120. Therefore, it is unnecessary to add an additional metal mesh 10 between the first transparent electrode 120 and the piezoelectric material layer 140 in order to solve the problem of the electric conductivity of the first transparent electrode 120 decreasing, which will bring about problems such as the decrease of the light transmittance, thereby increasing the manufacturing cost and lowering the display efficiency.

In some examples, as illustrated by FIG. 4, a material of the first transparent electrode 120 may be a transparent conductive oxide.

For example, as illustrated by FIG. 4, the material of the first transparent electrode 120 may be a transparent conductive oxide, and the material of the first transparent conductive anti-diffusion layer 130 may be a doped transparent conductive oxide. The material of the first transparent conductive anti-diffusion layer 130 is a doped material of the first transparent electrode 120, which can effectively prevent oxygen in the first transparent electrode 120 from entering the piezoelectric material layer 140. Moreover, the first transparent conductive anti-diffusion layer 130 itself has electric conductivity, and can form a conductive laminated structure with the first transparent electrode 120. Therefore, in the case the first transparent conductive anti-diffusion layer 130 is added in the vibration device 100, the vibration device 100 can avoid increasing a thickness of the vibration device while ensuring the conductive performance of the conductive laminated structure to meet the requirements, and achieve the lightness and thinness of the vibration device.

In addition, because the material of the first transparent electrode 120 can be a transparent conductive oxide and the material of the first transparent conductive anti-diffusion layer 130 can be a doped transparent conductive oxide, a contact resistance between the first transparent electrode 120 and the first transparent conductive anti-diffusion layer 130 is relatively small.

In some examples, as illustrated by FIG. 3, the material of the first transparent conductive anti-diffusion layer 130 may be a fluorine-doped transparent conductive oxide.

In some examples, as illustrated by FIG. 4, the material of the first transparent electrode 120 may be indium tin oxide (ITO).

For example, as illustrated by FIG. 4, the material of the first transparent electrode 120 may be indium tin oxide (ITO), and the material of the first transparent conductive anti-diffusion layer 130 may be fluorine-doped indium tin oxide (FTO). Although an electric conductivity of FTO is slightly worse than that of ITO, FTO can isolate the oxygen of ITO from entering the piezoelectric material layer 140, thus the electric conductivity of ITO will not be affected. Meanwhile, FTO has the advantages of relatively low cost, easy laser etching and suitable optical properties.

Figure 5:
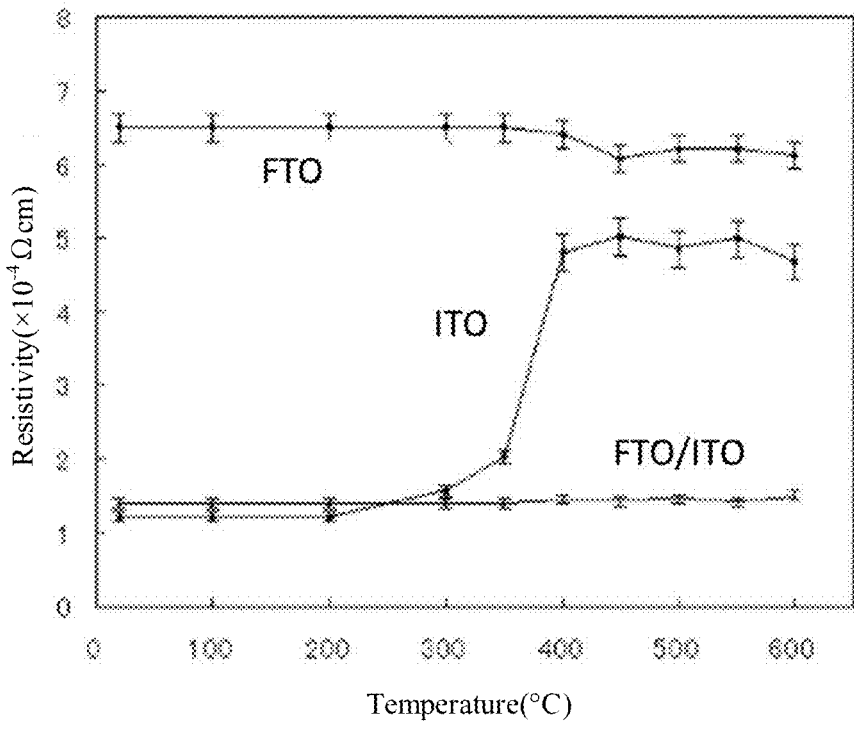
FIG. 5 is a diagram of changes of resistivity of FTO/ITO laminated structure with temperatures according to an embodiment of the present disclosure.

FIG. 5 is a diagram of changes of resistivity of FTO/ITO laminated structure with temperature according to an embodiment of the present disclosure. As illustrated by FIG. 5, a resistivity of ITO will increase when the temperature exceeds 300° C., and then the electric conductivity of ITO will deteriorate; and a resistivity of FTO is relatively large and its electric conductivity is relatively poor, but its resistivity is basically unaffected by temperature. The laminated structure formed by FTO and ITO has a small resistivity which is basically the same as that of ITO, and the laminated structure further has a characteristic that the resistivity is not affected by temperature. For example, when the temperature exceeds 300° C., the resistivity of laminated structure formed by FTO and ITO will not increase with the increase of temperature, and the laminated structure still has good electric conductivity. Therefore, FTO can be added between ITO and the piezoelectric material layer of vibration device. When the piezoelectric material is annealed at high temperature (for example, between 550° C. and 650° C.), the electric conductivity of FTO/ITO laminated structure will not be affected by high temperature (for example, between 550° C. and 650° C.), and good electric conductivity can still be maintained. Therefore, it is unnecessary to add an additional metal mesh between the first transparent electrode and the piezoelectric material layer in order to solve the problem of the electric conductivity of the first transparent electrode decreasing, which will bring about problems such as the decrease of light transmittance, the increase of manufacturing cost and the decrease of display efficiency.

In some examples, as illustrated by FIG. 4, the piezoelectric material layer can be a transparent piezoelectric thin film, so that the touch display panel can have better light transmittance and improve display efficiency.

In some examples, as illustrated by FIG. 4, the piezoelectric material layer may be lead zirconate titanate. Lead zirconate titanate has excellent piezoelectric and dielectric properties, good stability and high precision, and is widely used in the field of vibration devices.

For example, as illustrated by FIG. 4, if the piezoelectric material layer is lead zirconate titanate, the lead zirconate titanate is easy to lose oxygen under the high-temperature (for example, between 550° C. and 650° C.) annealing process, and adding the first transparent conductive anti-diffusion layer between the piezoelectric material layer and the first transparent electrode can further play a role in preventing the lead zirconate titanate from losing oxygen.

In some examples, as illustrated by FIG. 4, a thickness of the first transparent conductive anti-diffusion layer 130 may be any value from 25 nm to 1000 nm. For example, the thickness of the first transparent conductive anti-diffusion layer 130 may be 50 nm, 100 nm, 200 nm, 400 nm, 600 nm and 800 nm.

In some examples, as illustrated by FIG. 4, a thickness of the piezoelectric material layer 140 is any value from 1 μm to 10 μm. For example, the thickness of the piezoelectric material layer 140 may be 2 μm, 4 μm, 6 μm, 8 μm and 9 μm.

In some examples, as illustrated by FIG. 4, a thickness of the first transparent electrode 120 is any value from 100 nm to 500 nm. For example, the thickness of the first transparent electrode 120 may be 150 nm, 200 nm, 250 nm, 350 nm, 400 nm and 450 nm.

In some examples, as illustrated by FIG. 4, the electric conductivity of the first transparent conductive anti-diffusion layer 130 may be less than that of the first transparent electrode 120.

In some examples, as illustrated by FIG. 4, the vibration device 100 further includes a second transparent electrode 150, which is located at a side of the piezoelectric material layer 140 away from the base substrate 110.

In some examples, as illustrated by FIG. 4, a material of the second transparent electrode 150 may be a transparent conductive oxide. For example, the material of the second transparent electrode 150 may be ITO.

In some examples, as illustrated by FIG. 4, a thickness of the second transparent electrode 150 is any value from 100 nm to 500 nm. For example, the thickness of the second transparent electrode 150 may be 150 nm, 200 nm, 250 nm, 350 nm, 400 nm and 450 nm.

In some examples, as illustrated by FIG. 4, the piezoelectric material layer 140 may be formed by magnetron sputtering or vapor deposition. Magnetron sputtering or vapor deposition is a common and mature process for forming thin films on the surface of substrates.

For example, as illustrated by FIG. 4, the first transparent electrode may also be formed by magnetron sputtering or vapor deposition. For example, the first transparent conductive anti-diffusion layer can also be formed by magnetron sputtering or vapor deposition. For example, the second transparent electrode can also be formed by magnetron sputtering or vapor deposition.

Figure 6:
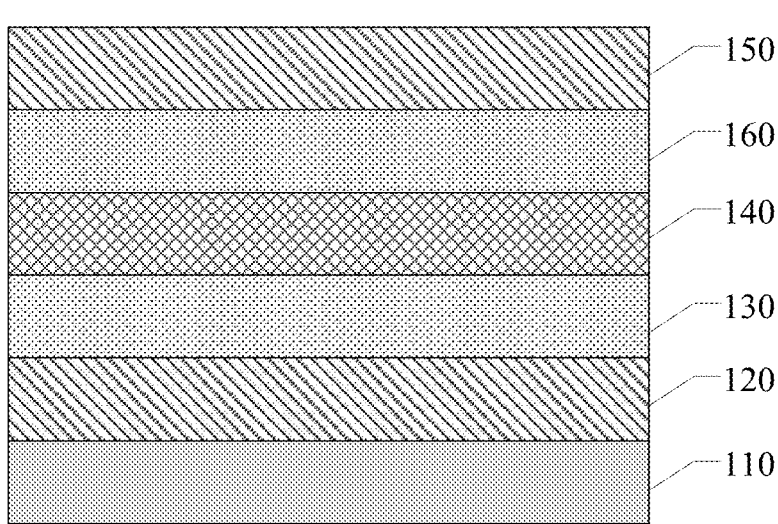
FIG. 6 is a schematic plan view of another vibration device provided by an embodiment of the present disclosure.

FIG. 6 is a schematic plan view of another vibration device provided by an embodiment of the present disclosure. As illustrated by FIG. 6, the vibration device 100 includes a base substrate 110, a first transparent electrode 120, a first transparent conductive anti-diffusion layer 130, a piezoelectric material layer 140, a second transparent conductive anti-diffusion layer 160 and a second transparent electrode 150. The first transparent electrode 120 is located on the base substrate 110, the first transparent conductive anti-diffusion layer 130 is located on a side of the first transparent electrode 120 away from the base substrate 110, and the piezoelectric material layer 140 is located on a side of the first transparent conductive anti-diffusion layer 130 away from the base substrate 110. The second transparent conductive anti-diffusion layer 160 is located on a side of the piezoelectric material layer 140 away from the base substrate 110. The second transparent electrode 150 is located on a side of the second transparent conductive anti-diffusion layer 160 away from the base substrate 110. The first transparent conductive anti-diffusion layer 130 is configured to prevent oxygen in the first transparent electrode 120 from entering the piezoelectric material layer 140. The second transparent conductive anti-diffusion layer 160 is configured to prevent oxygen in the second transparent electrode 150 from entering the piezoelectric material layer 140. By arranging the first transparent conductive anti-diffusion layer 130 between the first transparent electrode 120 and the piezoelectric material layer 140, oxygen in the first transparent electrode 120 can be prevented from entering the piezoelectric material layer 140, and by arranging the second transparent conductive anti-diffusion layer 160 between the second transparent electrode 150 and the piezoelectric material layer 140, oxygen in the second transparent electrode 150 can be prevented from entering the piezoelectric material layer 140, so that the electric conductivity of the second transparent electrode 150 will not be reduced, and the display efficiency will not be reduced. Moreover, the first transparent conductive anti-diffusion layer 130 itself has electric conductivity and can be used as the driving electrode of the piezoelectric material layer 140 together with the first transparent electrode 120, and the second transparent conductive anti-diffusion layer 160 itself has electric conductivity and can be used as the driving electrode of the piezoelectric material layer 140 together with the second transparent electrode 150.

In the vibration device 100 provided by the embodiment of the present disclosure, by arranging the first transparent conductive anti-diffusion layer 130 between the first transparent electrode 120 and the piezoelectric material layer 140, oxygen in the first transparent electrode 120 can be prevented from entering the piezoelectric material layer 140, for example, during the high-temperature annealing process of the piezoelectric material layer 140 (for example, the temperature is between 550° C. and 650° C.), the first transparent conductive anti-diffusion layer 130 can prevent oxygen in the first transparent electrode 120 from entering the piezoelectric material layer 140. Therefore, it is unnecessary to add an additional metal mesh 10 between the first transparent electrode 120 and the piezoelectric material layer 140 in order to solve the problem of the electric conductivity of the first transparent electrode 120 decreasing, which will bring about problems such as the decrease of light transmittance, the increase of manufacturing cost and the decrease of display efficiency. By arranging the second transparent conductive anti-diffusion layer 160 between the second transparent electrode 150 and the piezoelectric material layer 140, oxygen in the second transparent electrode 150 can be prevented from entering the piezoelectric material layer, so that the electric conductivity of the second transparent electrode 150 will not be reduced, and the display efficiency will not be reduced.

In some examples, as illustrated by FIG. 6, both arranging the first transparent conductive anti-diffusion layer 130 between the first transparent electrode 120 and the piezoelectric material layer 140 and arranging the second transparent conductive anti-diffusion layer 160 between the second transparent electrode 150 and the piezoelectric material layer 140 can simultaneously solve the problem of electric conductivity reduction of the first transparent electrode 120 and the second transparent electrode 150 of the vibration device 100.

For example, as illustrated by FIG. 6, the materials of the first transparent electrode 120 and the second transparent electrode 150 may be transparent conductive oxides, and the materials of the first transparent conductive anti-diffusion layer 130 and the second transparent conductive anti-diffusion layer 160 may be doped transparent conductive oxides. The first transparent conductive anti-diffusion layer 130 itself further has electric conductivity and can form a conductive laminated structure with the first transparent electrode 120. Therefore, in the case the first transparent conductive anti-diffusion layer 130 is added in the vibration device 100, the vibration device 100 can avoid increasing the thickness of the vibration device while ensuring the resistivity of the conductive laminated structure to meet the requirements, and achieve the thinning of the vibration device. Similarly, the second transparent conductive anti-diffusion layer 160 itself also has electric conductivity, and can form a conductive laminated structure with the second transparent electrode 150. Therefore, in the case that the second transparent conductive anti-diffusion layer 160 is added in the vibration device 100, the vibration device 100 can avoid increasing the thickness of the vibration device while ensuring the resistivity of the conductive laminated structure to meet the requirements, and achieve the lightness and thinness of the vibration device.

In addition, because the material of the first transparent conductive anti-diffusion layer 130 can be a doped material of the first transparent electrode 120, the contact resistance between the first transparent electrode 120 and the first transparent conductive anti-diffusion layer 130 is relatively small. Similarly, the material of the second transparent conductive anti-diffusion layer 160 can be a doped material of the second transparent electrode 150, so the contact resistance between the second transparent electrode 150 and the second transparent conductive anti-diffusion layer 160 is relatively small.

In some examples, as illustrated by FIG. 6, the first transparent electrode 120, the first transparent conductive anti-diffusion layer 130, the piezoelectric material layer 140, the second transparent conductive anti-diffusion layer 160, and the second transparent electrode 150 may be arranged in direct contact in sequence.

For example, as illustrated by FIG. 6, the material of the first transparent electrode 120 and the second transparent electrode 150 may be indium tin oxide (ITO); for example, the material of the first transparent conductive anti-diffusion layer 130 and the second transparent conductive anti-diffusion layers 160 may be fluorine-doped indium tin oxide (FTO).

For example, as illustrated by FIG. 6, the first transparent electrode 120 and the first transparent conductive anti-diffusion layer 130 can form an FTO/ITO laminated structure, which has a small resistivity basically consistent with that of ITO, and meanwhile, the laminated structure further has the characteristic that the resistivity is not affected by temperature. The second transparent electrode 150 and the second transparent conductive anti-diffusion layer 160 can also form an FTO/ITO laminated structure, which also has a small resistivity basically consistent with that of pure ITO, and meanwhile, the laminated structure further has the characteristic that the resistivity is not affected by temperature. Therefore, the electric conductivity of the vibration device 100 will not be affected by the high-temperature (for example, between 550° C. and 650° C.) annealing process, and it can still maintain good electric conductivity.

For example, as illustrated by FIG. 6, the piezoelectric material layer 140 of the vibration device 100 can be a transparent piezoelectric thin film, so that the touch display panel can have better light transmittance and the display efficiency is improved.

For example, as illustrated by FIG. 6, the material of the piezoelectric material layer 140 may be lead zirconate titanate.

For example, as illustrated by FIG. 6, in the case that the piezoelectric material layer 140 is lead zirconate titanate, the lead zirconate titanate is easy to lose oxygen under the high-temperature (for example, between 550° C. and 650° C.) annealing process. Adding the first transparent conductive anti-diffusion layer 130 between the piezoelectric material layer 140 and the first transparent electrode 120 and adding the second transparent conductive anti-diffusion layer 160 between the piezoelectric material layer 140 and the second transparent electrode 150 can further play a role in preventing the lead zirconate titanate from losing oxygen.

In some examples, as illustrated by FIG. 6, the thickness of the first transparent conductive anti-diffusion layer 130 and the thickness of the second transparent conductive anti-diffusion layer 160 may be any value from 25 nm to 1000 nm. For example, the thickness of the first transparent conductive anti-diffusion layer 130 and the thickness of the second transparent conductive anti-diffusion layer 160 may be 50 nm, 100 nm, 200 nm, 400 nm. 600 nm and 800 nm.

In some examples, as illustrated by FIG. 6, the thickness of the first transparent electrode 120 and the thickness of the second transparent electrode 150 are any value from 100 nm to 500 nm. For example, the thickness of the first transparent electrode 120 and the thickness of the second transparent electrode 150 may be 150 nm, 200 nm, 250 nm, 350 nm, 400 nm and 450 nm.

In some examples, as illustrated by FIG. 6, the thickness of the piezoelectric material layer 140 is any value from 1 $\mu$m to 10 $\mu$m. For example, the thickness of the piezoelectric material layer 140 may be 2 $\mu$m, 4 $\mu$m, 6 $\mu$m, 8 $\mu$m and 9 $\mu$m.

In some examples, as illustrated by FIG. 6, the electric conductivity of the first transparent conductive anti-diffusion layer 130 may be less than that of the first transparent electrode 120.

In some examples, as illustrated by FIG. 6, the piezoelectric material layer 140 may be formed by magnetron sputtering or vapor deposition. Magnetron sputtering or vapor deposition is a common and mature process for forming thin films on the surface of substrates.

For example, as illustrated by FIG. 6, the first transparent electrode may also be formed by magnetron sputtering or vapor deposition. For example, the first transparent conductive anti-diffusion layer can also be formed by magnetron sputtering or vapor deposition. For example, the second transparent electrode can also be formed by magnetron sputtering or vapor deposition.

Figure 7:
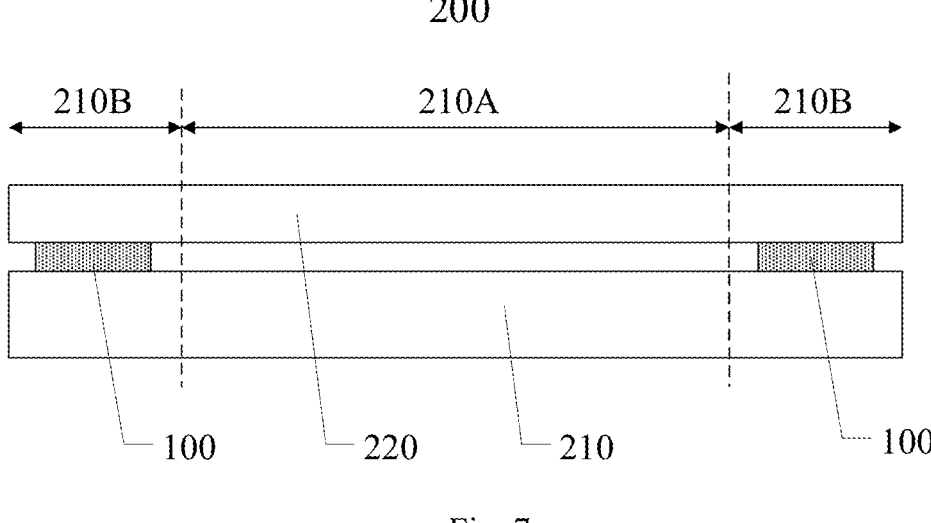
FIG. 7 is a schematic plan view of a touch display panel provided by an embodiment of the present disclosure.

An embodiment of the present disclosure provides a touch display panel. FIG. 7 is a schematic plan view of a touch display panel provided by an embodiment of the present disclosure. As illustrated by FIG. 7, the touch display panel 200 includes any one of the vibration devices 100 mentioned above. Therefore, the touch display panel 200 has beneficial effects corresponding to that of the vibration device 100, for details, please refer to the related description of the vibration device.

For example, as illustrated by FIG. 7, the touch display panel 200 includes a display panel 210, the vibration device 100 and a cover plate 220, the vibration device 100 is located on the display panel 210, and the cover plate 220 is located on a side of the vibration device 100 away from the display panel 210. The display panel 210 includes a display region 210A and a peripheral region 210B surrounding the display region 210A, and the vibration device 100 is located in the peripheral region 210B of the touch display panel 200.

For example, as illustrated by FIG. 7, the display panel 210 may be a liquid crystal display (LCD) panel or an organic light emitting diode (OLED) display panel.

For example, as illustrated by FIG. 7, the cover plate 220 may be a touch panel.

Figure 8:
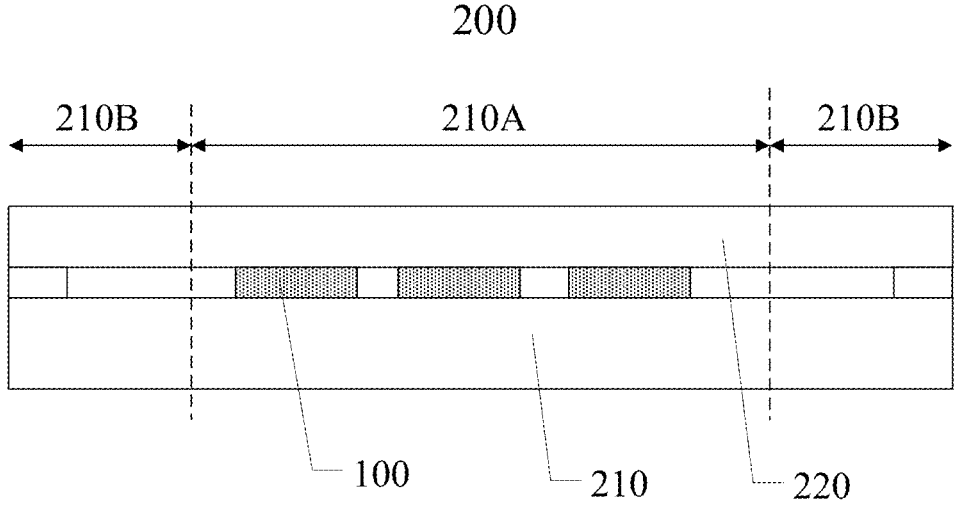
FIG. 8 is a schematic plan view of another touch display panel provided by an embodiment of the present disclosure.

FIG. 8 is a schematic plan view of another touch display panel provided by an embodiment of the present disclosure. As illustrated by FIG. 8, the touch display panel 200 includes any one of the vibration devices 100 mentioned above. Therefore, the touch display panel 200 has beneficial effects corresponding to that of the vibration device 100, for details, please refer to the related description of the vibration device.

For example, as illustrated by FIG. 8, the touch display panel 200 includes a display panel 210, the vibration device 100 and a cover plate 220, the vibration device 100 is located on the display panel 210, and the cover plate 220 is located on a side of the vibration device 100 away from the display panel 210. The display panel 210 includes a display region 210A and a peripheral region 210B surrounding the display region 210A, and the vibration device 100 is located in the display region 210A of the touch display panel 200. The piezoelectric material layer 140 of the vibration device 100 can be a transparent piezoelectric thin film, so that the touch display panel 200 has better light transmittance and better display effect.

For example, as illustrated by FIG. 8, the display panel 210 may be a liquid crystal display (LCD) panel or an organic light emitting diode (OLED) display panel.

For example, as illustrated by FIG. 8, the cover plate 220 may be a touch panel.

Figure 9:
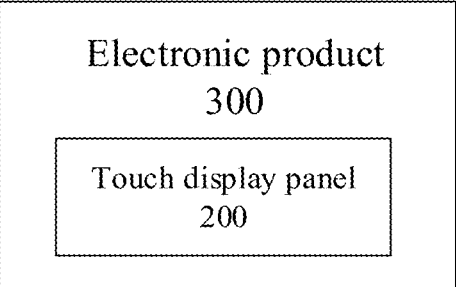
FIG. 9 is a schematic plan view of an electronic product provided by an embodiment of the present disclosure.

An embodiment of the present disclosure provides an electronic product. FIG. 9 is a schematic plan view of an electronic product provided by an embodiment of the present disclosure. As illustrated by FIG. 9, the electronic product 300 includes any one of the touch display panels 200 mentioned above. Therefore, the electronic product 300 has beneficial effects corresponding to the beneficial effects of the touch display panel 200. For details, please refer to the related description of the above touch display panel.

For example, the electronic product 300 can be any product with touch display function such as a liquid crystal display, a smart phone, a tablet computer, a television, a display, a smart watch, a notebook computer, a digital photo frame, a navigator and the like.

The following points required to be explained:

(1) the drawings of the embodiments of the present disclosure only relate to the structures related to the embodiments of the present disclosure, and other structures can refer to the general design.

(2) without conflict, the embodiments of the present disclosure and the features in the embodiments may be combined with each other to obtain new embodiments.

What are described above is related to only the illustrative embodiments of the present disclosure and not limitative to the protection scope of the present application. Therefore, the protection scope of the present application shall be defined by the accompanying claims.

The invention claimed is:

1. A vibration device, comprising:

a base substrate;

a first transparent conductive anti-diffusion layer, located on the base substrate;

a piezoelectric material layer, located at a side of the first transparent conductive anti-diffusion layer away from the base substrate, and a second transparent electrode, located at a side of the piezoelectric material layer away from the base substrate, wherein the first transparent conductive anti-diffusion layer is configured to prevent oxygen from entering the piezoelectric material layer, the vibration device further comprising:

a first transparent electrode, located at a side of the base substrate close to the first transparent conductive anti-diffusion layer, and located between the base substrate and the first transparent conductive anti-diffusion layer, wherein a material of the first transparent conductive anti-diffusion layer is a doped material of the first transparent electrode, the first transparent electrode is in direct contact with the first transparent conductive anti- diffusion layer, an orthographic projection of an area where the first transparent electrode is in direct contact with the first transparent conductive anti-diffusion layer on the base substrate overlaps with an orthographic projection of the second transparent electrode on the base substrate, the first transparent conductive anti-diffusion layer is further configured to prevent the piezoelectric material layer from losing oxygen.

2. The vibration device according to claim 1, wherein a material of the first transparent conductive anti-diffusion layer is a doped transparent conductive oxide.

3. The vibration device according to claim 2, wherein a material of the first transparent conductive anti-diffusion layer is a fluorine-doped indium tin oxide.

4. The vibration device according to claim 1, wherein the piezoelectric material layer is a transparent piezoelectric thin film.

5. The vibration device according to claim 4, wherein a material of the piezoelectric material layer is one or more of selected from the group consisting of lead zirconate titanate, aluminum nitride and potassium sodium niobite.

6. The vibration device according to claim 1, wherein a thickness of the first transparent conductive anti-diffusion layer ranges from 400 nm to 1000 nm.

7. The vibration device according to claim 1, wherein a thickness of the piezoelectric material layer ranges from 1 μm to 10 μm.

8. The vibration device according to claim 1, wherein a material of the first transparent electrode is a transparent conductive oxide.

9. The vibration device according to claim 1, wherein a thickness of the first transparent electrode ranges from 100 nm to 350 nm, a thickness of the first transparent conductive anti-diffusion layer ranges from 400 nm to 1000 nm.

10. The vibration device according to claim 1, wherein an electric conductivity of the first transparent conductive anti-diffusion layer is smaller than an electric conductivity of the first transparent electrode.

11. The vibration device according to claim 1, further comprising:

a second transparent conductive anti-diffusion layer located between the piezoelectric material layer and the second transparent electrode layer, wherein the second transparent conductive anti-diffusion layer is configured to prevent oxygen in the second transparent electrode from entering the piezoelectric material layer.

12. The vibration device according to claim 11, wherein a material of the second transparent conductive anti-diffusion layer is a doped material of the second transparent electrode.

13. The vibration device according to claim 1, wherein a material of the second transparent electrode is a transparent conductive oxide.

14. A touch display panel, comprising the vibration device according to claim 1.

15. An electronic product, comprising the touch display panel according to claim 14.

16. The touch display panel according to claim 14, further comprising a display panel and a cover plate, wherein the vibration device is located on the display panel, and the cover plate is located on a side of the vibration device away from the display panel, the display panel comprises a display region and a peripheral region surrounding the display region, and the vibration device is located in the peripheral region of the touch display panel.

17. The touch display panel according to claim 14, further comprising a display panel and a cover plate, wherein the vibration device is located on the display panel, and the cover plate is located on a side of the vibration device away from the display panel, the display panel comprises a display region and a peripheral region surrounding the display region, and the vibration device is located in the display region of the touch display panel, the piezoelectric material layer comprises a transparent piezoelectric thin film.

18. The vibration device according to claim 1, wherein the material of the first transparent conductive anti-diffusion layer comprises a host material and a doping material doped in the host material, and the host material is the same as a material of the first transparent electrode.

19. The touch display panel according to claim 1, the area where the first transparent electrode is in direct contact with the first transparent conductive anti-diffusion layer is equal to an area of the first transparent electrode, an area of the first transparent conductive anti-diffusion layer, or both.

20. The touch display panel according to claim 1, the area where the first transparent electrode is in direct contact with the first transparent conductive anti-diffusion layer is equal to an area of the second transparent electrode.

* * * * *